(12) United States Patent
Yarom

(10) Patent No.: US 6,815,978 B1
(45) Date of Patent: Nov. 9, 2004

(54) SINGLE CLOCK SOURCE FOR PLURAL SCAN CAPTURE CHAINS

(75) Inventor: Itai Yarom, Mevaseret-Zion (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/419,433

(22) Filed: Apr. 21, 2003

(51) Int. Cl.[7] .......................................... H03K 19/173
(52) U.S. Cl. ................. 326/16; 326/9; 326/14
(58) Field of Search ............... 326/9, 14, 16, 326/93

(56) References Cited

U.S. PATENT DOCUMENTS 6,418,545 B1 * 7/2002 Adusumilli ................. 714/729
6,686,759 B1 * 2/2004 Swamy ....................... 324/765

* cited by examiner

*Primary Examiner*—Anh Q. Tran
(74) *Attorney, Agent, or Firm*—Buckley, Maschoff & Talwalkar LLC (57) ABSTRACT

A clock signal is applied to a clock pin of an integrated circuit. The clock signal is coupled from the clock pin to a first scan chain in a first time period without coupling the clock signal to a second scan chain during the first time period. The clock signal is coupled from the clock pin to the second scan chain during a second time period without coupling the clock signal to the first scan chain during the second time period.

10 Claims, 9 Drawing Sheets

SINGLE CLOCK SOURCE FOR PLURAL SCAN CAPTURE CHAINS

BACKGROUND

In integrated circuits, scan capture chains (also known as "scan chains") may be provided to permit capturing of test information during device test procedures. Often it is not practical to clock plural scan chains with the same clock signal because the scanning operations of the scan chains may conflict with each other. It has therefore been proposed to provide separate clocks for scan chains that would otherwise conflict. However, the provision of separate clocks increases the number of device pins used for scan chain clocking. This creates an undesirable increase in the competition for pins, which are a scarce resource in device design.

DETAILED DESCRIPTION

Figure 1:
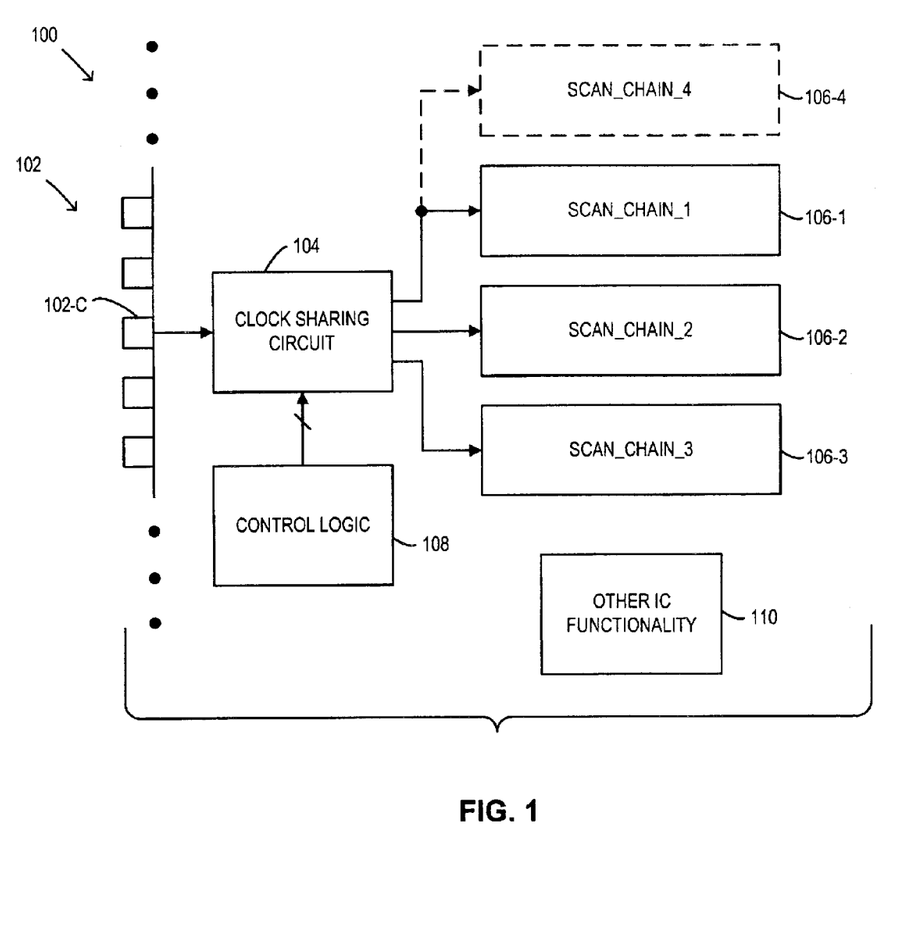
FIG. 1 is a partial schematic block diagram of an integrated circuit according to some embodiments.

FIG. 1 is a partial schematic block diagram of an integrated circuit 100 according to some embodiments. The integrated circuit 100 includes a plurality of contact pins 102, including a clock pin 102-C to which a clock signal may be applied by a clock generator which is external to the integrated circuit and which is not shown.

The integrated circuit 100 also includes a clock sharing circuit 104 which is coupled to the clock pin 102-C. The integrated circuit 100 further includes scan chains including a first scan chain 106-1, a second scan chain 106-2 and a third scan chain 106-3, each of which is coupled to the clock sharing circuit 104. The arrangement of the scan chains themselves may be provided in accordance with conventional practices. The organization of the scan chains is such that concurrent clocking of the scan chains may result in scan failure. As will be seen, the clock sharing circuit 104 is operable to selectively couple the scan chains 106-1 through 106-3 to the clock pin 102-C at mutually different time periods.

A fourth scan chain 106-4, which may or may not be present, is shown in phantom and will be discussed below. The integrated circuit 100 may also include other scan chains, which are not shown.

The integrated circuit 100 also includes control logic 108 which provides control signals to the clock sharing circuit 104.

Also included in the integrated circuit 100 are other circuit components, generally represented by block 110, by which the integrated circuit performs its intended functions. For example, the integrated circuit 100 may be a network processor, and the components 110 may be constituted by conventional components of a network processor. Alternatively, the integrated circuit 100 may be a microprocessor, and the components 110 may be constituted by conventional components of a microprocessor.

Figure 2:
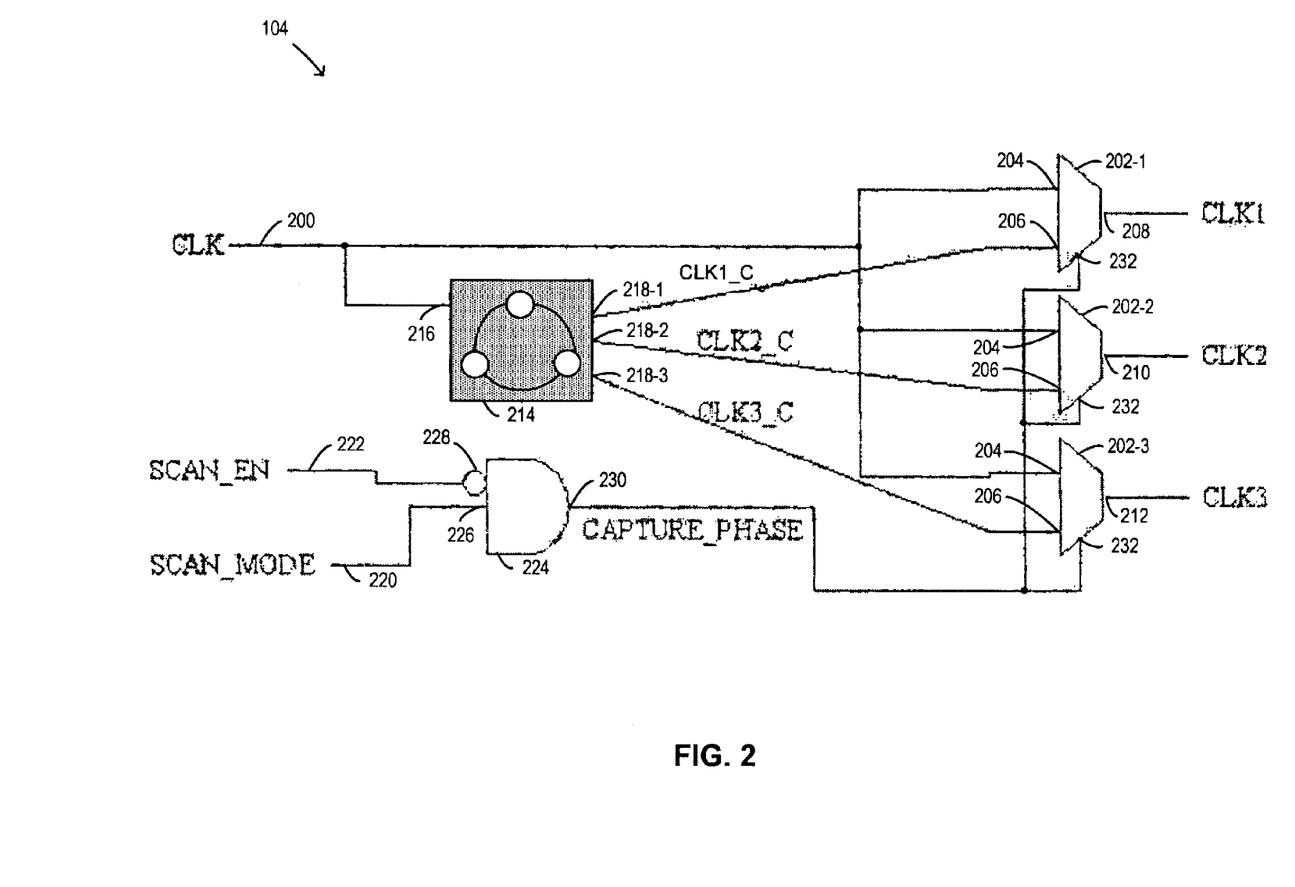
FIG. 2 is a schematic logic diagram of a clock sharing circuit that is part of the integrated circuit of FIG. 1.

FIG. 2 is a schematic logic diagram that illustrates the clock sharing circuit 104 shown in FIG. 1.

The clock sharing circuit 104 has a clock input terminal 200 which is coupled to the clock pin 102-C (FIG. 1) to receive a clock signal CLK. Also included in the clock sharing circuit 104 are multiplexers 202-1, 202-2 and 202-3. Each of the multiplexers 202-1, 202-2, 202-3 has a first input 204 and a second input 206. The first inputs 204 of all of the multiplexers 202-1, 202-2, 202-3 are coupled in parallel to the clock input 200.

The multiplexer 202-1 has an output terminal 208 which is coupled to the first scan chain 106-1 (FIG. 1) to provide a clock signal CLK1 to the first scan chain 106-1.

The multiplexer 202-2 has an output terminal 210 which is coupled to the second scan chain 106-2 (FIG. 1) to provide a clock signal CLK2 to the second scan chain 106-2.

The multiplexer 202-3 has an output terminal 212 which is coupled to the third scan chain 106-3 (FIG. 1) to provide a clock signal CLK3 to the third scan chain 106-3.

The clock sharing circuit 104 also includes a state machine 214, which has an input 216 coupled to the clock input terminal 200 of the clock sharing circuit 104 to receive the clock signal CLK. The state machine 214 also has outputs 218-1, 218-2 and 218-3. The output 218-1 of the state machine 214 is coupled to the second input 206 of the multiplexer 202-1 to provide a signal CLK1_C to the second input of the multiplexer 202-1. The output 218-2 of the state machine 214 is coupled to the second input 206 of the multiplexer 202-2 to provide a signal CLK2_C to the second input of the multiplexer 202-2. The output 218-3 of the state machine 214 is coupled to the second input 206 of the multiplexer 202-3 to provide a signal CLK3_C to the second input of the multiplexer 202-3.

The clock sharing circuit 104 also has a first control input terminal 220 coupled to the control logic 108 (FIG. 1) to receive a first control signal SCAN_MODE and a second control input terminal 222 coupled to the control logic 108 to receive a second control signal SCAN_EN (scan enable).

Also included in the clock sharing circuit 104 is an AND gate 224. The AND gate 224 has a first (non-inverting) input 226 coupled to the first control input terminal 220 and a second (inverting) input 228 coupled to the second control input terminal 222. The AND gate 224 has an output 230 which is coupled in parallel to switching inputs 232 of the multiplexers 202-1, 202-2 and 202-3, to supply a switching signal CAPTURE_PHASE to the switching inputs 232. The switching signal CAPTURE_PHASE is asserted when the first control signal SCAN_MODE is asserted and the second control signal SCAN_EN is unasserted. At other times the switching signal CAPTURE_PHASE is inactive.

When the switching signal CAPTURE_PHASE is unasserted, the multiplexers 202-1, 202-2, 202-3 couple the clock signal CLK from the clock pin 102-C (FIG. 1) in parallel to the output terminals 208, 210, 212 of the multiplexers 202-1, 202-2, 202-3. When the switching signal CAPTURE_PHASE is asserted: the multiplexer 202-1 couples the signal CLK1_C from the output 218-1 of the state machine 214 to the output 208 of the multiplexer 202-1; the multiplexer 202-2 couples the signal CLK2_C from the output 218-2 of the state machine 214 to the output 210 of the multiplexer 202-2; and the multiplexer 202-3 couples the signal CLK3_C from the output 218-3 of the state machine 214 to the output 212 of the multiplexer 202-3.

Figure 3:
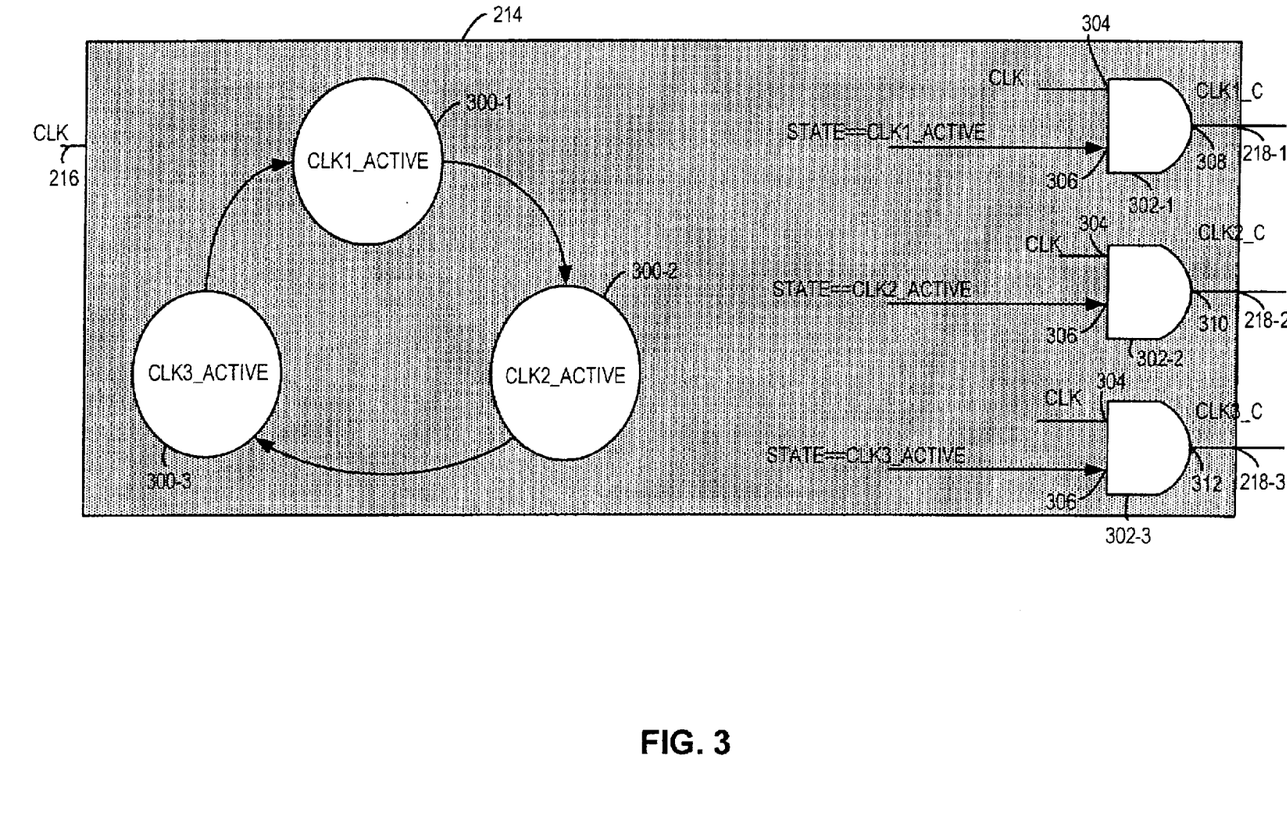
FIG. 3 is a diagram representing operation of a state machine that is part of the clock sharing circuit of FIG. 2.

FIG. 3 is a diagram illustrating operation of the state machine 214 shown in FIG. 2.

The state machine 214 has three states 300-1, 300-2 and 300-3 which are schematically illustrated in FIG. 3. The state machine 214 also has AND gates 302-1, 302-2 and 302-3. Each of the AND gates 302-1, 302-2, 302-3 has a first input 304 and a second input 306. The first inputs 304 of all three of the AND gates 302-1, 302-2, 302-3 are coupled in parallel to the input 216 of the state machine 214 to receive the clock signal CLK. The AND gate 302-1 has an output 308 coupled to the output 218-1 of the state machine 214. The AND gate 302-2 has an output 310 coupled to the output 218-2 of the state machine 214. The AND gate 302-3 has an output 312 coupled to the output 218-3 of the state machine 214.

When the state machine 214 is in state 300-1, a signal CLK1_ACTIVE is asserted at the second input 306 of the AND gate 302-1. When the state machine 214 is in state 300-2, a signal CLK2_ACTIVE is asserted at the second input 306 of the AND gate 302-2.

When the state machine 214 is in state 300-3, a signal CLK3_ACTIVE is asserted at the second input 306 of the AND gate 302-3.

Consequently, when the state machine 214 is in state 300-1, the signal CLK1_C at the output 218-1 of the state machine 214 mirrors (i.e., is identical to) the input clock signal CLK; at other times the signal CLK1_C is unasserted. When the state machine 214 is in state 300-2, the signal CLK2_C at the output 218-2 of the state machine 214 mirrors the input clock signal CLK; at other times the signal CLK2_C is unasserted. When the state machine 214 is in state 300-3, the signal CLK_C at the output 218-3 of the state machine 214 mirrors the input clock signal CLK; at other times the signal CLK3_C is unasserted.

When the state machine 214 is in state 300-1, it transitions to state 300-2 in response to the next clock pulse of clock signal CLK. When the state machine 214 is in state 300-2, it transitions to state 300-3 in response to the next clock pulse of clock signal CLK. When the state machine 214 is in state 300-3, it transitions to state 300-1 in response to the next clock pulse of clock signal CLK.

Figure 4:
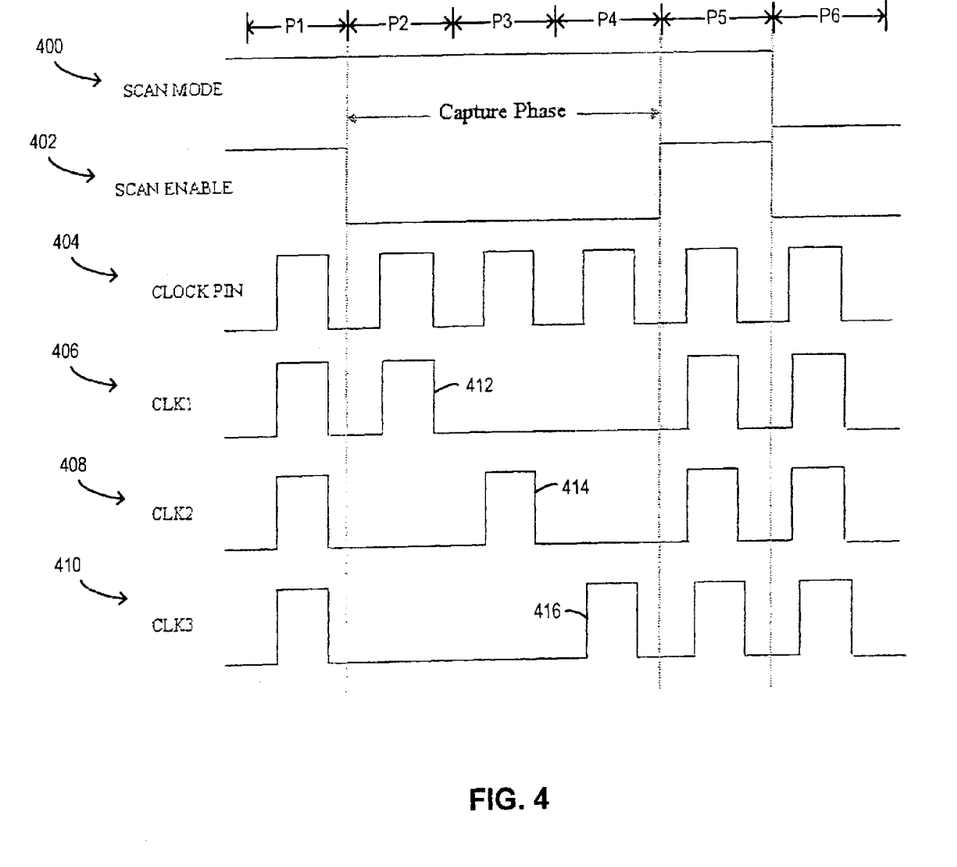
FIG. 4 is a waveform diagram that illustrates operation of the circuitry of FIGS. 1–3 in a test mode.

Operation of the circuitry of FIGS. 1–3 in regard to scanning will now be described with reference to FIGS. 4 and 4A. FIG. 4 is a waveform diagram that illustrates operation of the circuitry in a test mode. In FIG. 4, waveform 400 represents the control signal SCAN_MODE. Waveform 402 represents the control signal SCAN_EN. Waveform 404 represents the clock signal CLK applied to the clock pin 102-C (FIG. 1).

Waveform 406 represents the clock signal CLK1 at the output terminal 208 (FIG. 2) of the multiplexer 202-1 of the clock sharing circuit 104. CLK1 is supplied to the first scan chain 106-1 (FIG. 1).

Waveform 408 represents the clock signal CLK2 at the output terminal 210 (FIG. 2) of the multiplexer 202-2 of the clock sharing circuit 104. CLK 2 is supplied to the second scan chain 106-2 (FIG. 1).

Waveform 410 represents the clock signal CLK3 at the output terminal 212 (FIG. 2) of the multiplexer 202-3 of the clock sharing circuit 104. CLK3 is supplied to the third scan chain 106-3 FIG. 1).

During a time period $P_1$ (FIG. 4), both of the control signals SCAN_MODE and SCAN_EN are asserted. Consequently the output of the AND gate 224 (FIG. 2), CAPTURE_PHASE, is unasserted, and the clock input terminal 200 is coupled to all of the output terminals 208, 210, 212 by the multiplexers 202-1, 202-2 and 202-3, respectively. As a result the clock signals CLK1, CLK2, CLK3 mirror the clock signal CLK during the time period $P_1$, and the clock signal CLK is coupled to all of the scan chains 106-1, 106-2, 106-3 (FIG. 1).

During time period $P_2$ (FIG. 4), the control signal SCAN_MODE remains asserted but the control signal SCAN_N is unasserted, causing the integrated circuit 100 to enter the capture phase of the scan mode. The signal CAPTURE_PHASE, output from the AND gate 224 (FIG. 2), is asserted, switching over the multiplexers 202, so that the multiplexer 202-1 couples the output 218-1 of the state machine 214 to the output terminal 208 of the multiplexer 202-1; the multiplexer 202-2 couples the output 218-2 of the state machine 214 to the output terminal 210 of the multiplexer 202-2; and the multiplexer 202-3 couples the output 218-3 of the state machine 214 to the output terminal 212 of the multiplexer 202-3.

It is assumed for the sake of this example that the state machine 214 is in its state 300-1 during the time period $P_2$. As a result, the AND gate 302-1 (FIG. 3) provides a logic high output during the pulse of the clock signal CLK during the time period $P_2$, but the AND gates 302-2 and 302-3 do not provide logic high outputs during that time period. Thus the clock signal CLK is coupled from the clock pin 102-C (FIG. 1) to the first scan chain 106-1 during the time period $P_2$ (as indicated by the pulse 412 in CLK1, FIGS. 2 and 4), but the clock signal CLK is not coupled to the scan chains 106-2 and 106-3 during that time period.

During time period $P_3$ (FIG. 4), the capture phase continues, with SCAN_MODE asserted, SCAN_EN unasserted, CAPTURE_PHASE asserted, output 218-1 (FIG. 2) of the state machine 214 coupled to the output terminal 208 of the multiplexer 202-1, output 218-2 of the state machine 214 coupled to the output terminal 210 of the multiplexer 202-2, and output 218-3 of the state machine 214 coupled to the output terminal 212 of the multiplexer 202-3. The state machine 214 is now in its state 300-2, since the state machine 214 has transitioned from state 300-1 to state 300-2 in response to the pulse of the clock signal CLK in time period $P_2$. As a result, the AND gate 302-2 (FIG. 3) provides a logic high output during the pulse of the clock signal CLK during the time period $P_3$, but the AND gates 302-1 and 302-3 do not provide logic high outputs during that time period. Thus the clock signal CLK is coupled from the clock pin 102-C (FIG. 1) to the second scan chain 106-2 during the time period $P_3$ (as indicated by the pulse 414 in CLK2, FIGS. 2 and 4), but the clock signal CLK is not coupled to the scan chains 106-1 and 106-3 during that time period.

During time period $P_4$ (FIG. 4), the capture phase continues, with SCAN_MODE asserted, SCAN_EN unasserted, CAPTURE_PHASE asserted, output 218-1 (FIG. 2) of the state machine 214 coupled to the output terminal 208 of the multiplexer 202-1, output 218-2 of the state machine 214 coupled to the output terminal 210 of the multiplexer 202-2, and output 218-3 of the state machine 214 coupled to the output terminal 212 of the multiplexer 202-3. The state machine 214 is now in its state 300-3, since the state machine 214 has transitioned from state 300-2 to state 300-3 in response to the pulse of the clock signal CLK in time period $P_3$. As a result, the AND gate 302-3 (FIG. 3) provides a logic high output during the pulse of the clock signal CLK during the time period $P_4$, but the AND gates 302-1 and 302-3 do not provide logic high outputs during that time period. Thus the clock signal CLK is coupled from the clock pin 102-C (FIG. 1) to the third scan chain 106-3 during the time period $P_4$ (as indicated by the pulse 416 in CLK 2, FIGS. 2 and 4), but the clock signal CLK is not coupled to the scan chains 106-1 and 106-2 during that time period.

During time period $P_5$ (FIG. 4), SCAN_MODE remains asserted, but SCAN_EN is asserted, ending the capture phase of the scan mode. CAPTURE_PHASE is no longer asserted, so that the multiplexers 202-1, 202-2, 202-3 (FIG. 2) all couple the clock input terminal 200 of the clock sharing circuit 104 to the output terminals 208, 210, 212 of the multiplexers 202-1, 202-2, 202-3. As a result, the clock signals CLK1, CLK2, CLK3 all mirror the clock signal CLK, which is now coupled to all of the scan chains 106-1, 106-2, 106-3.

During time period $P_6$ (FIG. 4), both SCAN_MODE and SCAN_EN are unasserted, ending the scan mode, and placing the integrated circuit 100 in a normal operating mode. CAPTURE_PHASE is not asserted, and the clock signal CLK remains coupled to all of the scan chains 106-1, 106-2, 106-3. During the normal operating mode, suitable synchronization circuitry (not separately shown) may be operable to prevent conflicts among the scan chains. This synchronization circuitry is not operable during the capture phase, since each flip-flop (not separately shown) in the integrated circuit 100 may be set to an arbitrary value to check for structural flaws, hence the need for separate clocking of the various scan chains during the capture phase. (The integrated circuit is in the normal operating mode when it is performing its intended functions other than self-testing.)

Figure 4A:
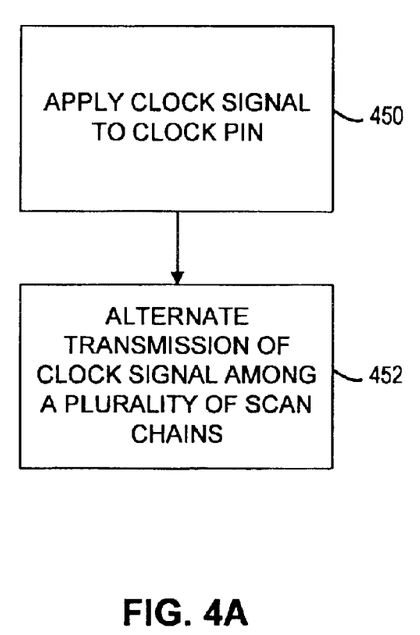
FIG. 4A is a flow chart that illustrates operation of the circuitry of FIGS. 1–3 in a test mode.

Operation of the integrated circuit 100 with respect to clocking of scan chains during scanning is illustrated in the form of a flow chart in FIG. 4A. At 450 in FIG. 4A, a clock signal is applied to the clock pin 102-C. At 452, the clock signal is alternatively transmitted among the scan chains 106-1 to 106-3.

With the presence of the clock sharing circuit 104 between the clock pin 102-C and the scan chains 106-1, 106-2 and 106-3, separate clock signals can be provided to the scan chains during respective periods of the scan mode capture phase while using only one pin as a clock input for the scan chains. Thus conflicts among the scan chains during the capture phase can be prevented, without increasing the number of clock pins required for the scan chains.

Although only one clock input pin is explicitly shown in FIG. 1, it should be understood that there may be additional clock input pins for other clock signals provided to other groups of scan chains or other portions of the integrated circuit 100, which are not separately shown.

Instead of sharing a single clock signal among three scan chains, as illustrated in FIGS. 2 and 3, a single clock signal may be shared among two, or four or more, scan chains, in which cases the clock sharing circuit may have a number of outputs corresponding to the number of scan chains which share the clock signal, and the state machine of the clock sharing circuit may have a number of states corresponding to the number of scan chains which share the clock signal.

In other embodiments, one or more of the outputs of the clock sharing circuit may each be shared by two or more scan chains, in a case where the two or more scan chains do not interfere with each other during scan capture phase. An example of such other embodiments is illustrated in FIGS. 5–7 (and also in FIG. 1, assuming that the fourth scan chain 106-4 is present).

Figure 5:
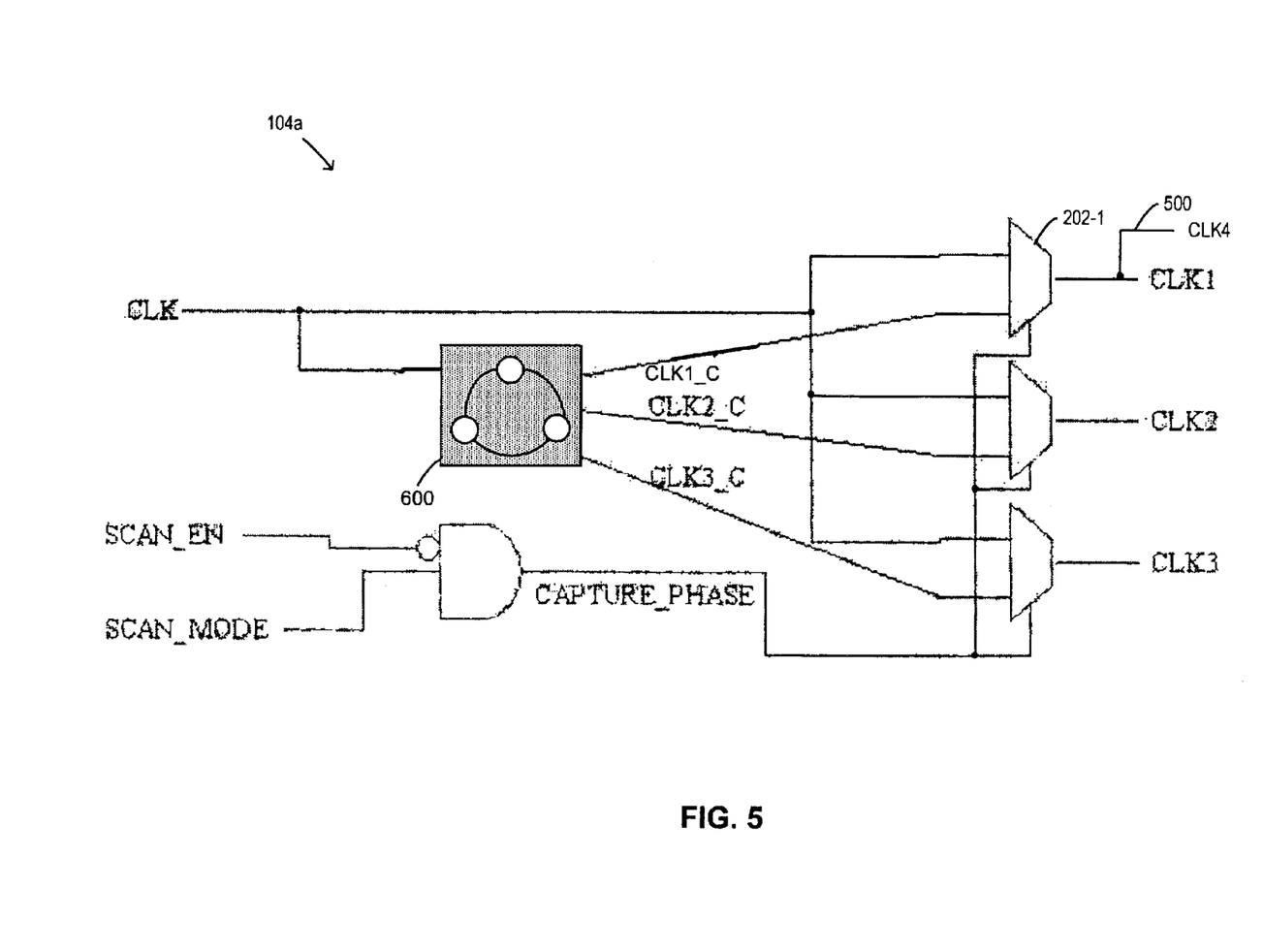
FIG. 5 is a diagram that is similar to FIG. 2, but showing an alternative arrangement of the clock sharing circuit according to some embodiments.

FIG. 5 is a schematic logic diagram that is the same as FIG. 2, except that in FIG. 5, the multiplexer 202-1 has an additional output terminal 500 which is coupled to the fourth scan chain 106-4 (FIG. 1) to supply a clock signal CLK4 to the fourth scan chain 106-4. The clock signal CLK4 is identical to the clock signal CLK1 supplied to the first scan chain 106-1. In other words, the scan chains 106-1 and 106-4 are connected in parallel to receive the output from the multiplexer 202-1.

Figure 6:
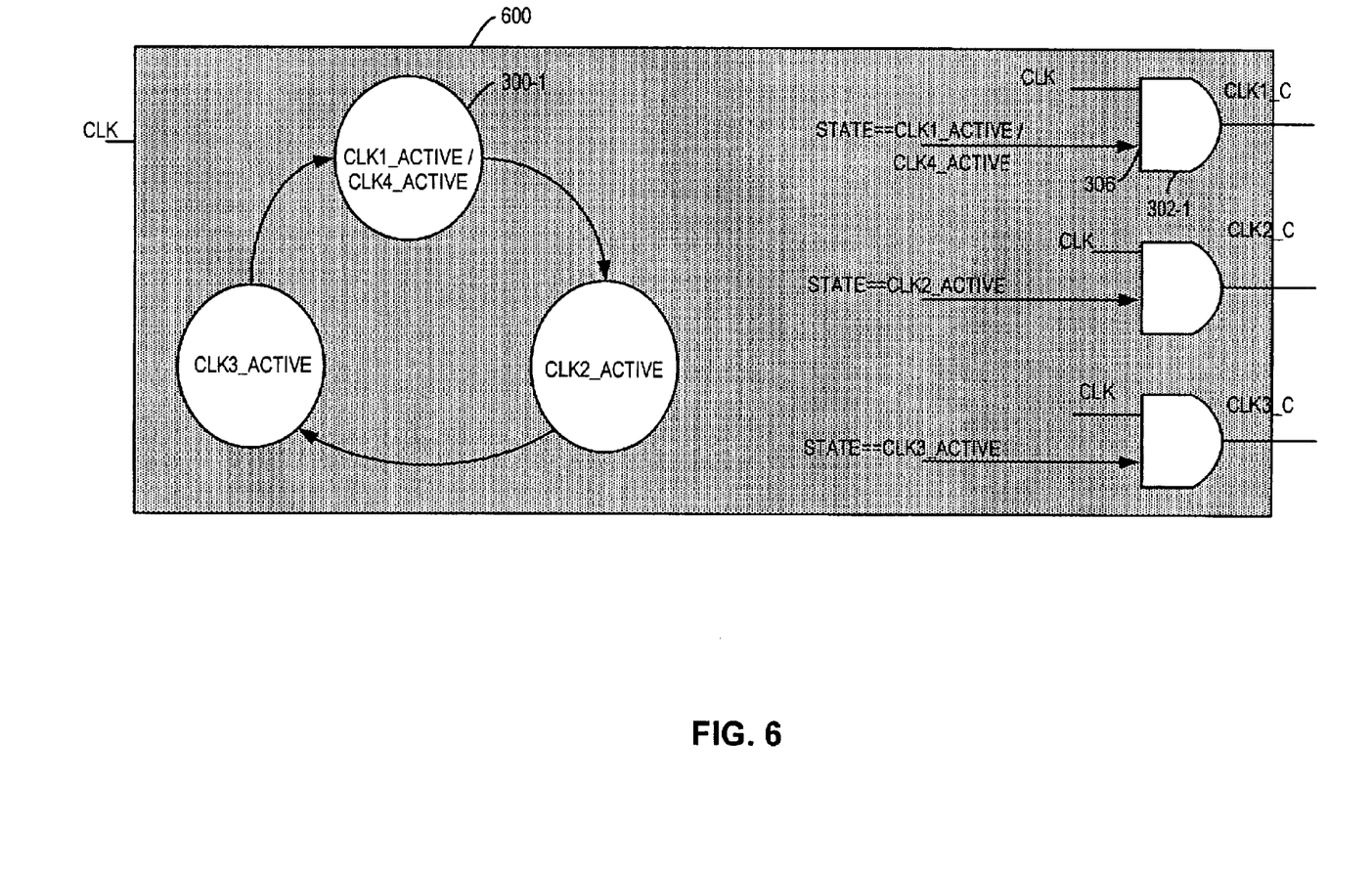
FIG. 6 is a representation that is similar to FIG. 3, but showing a state machine that is part of the clock sharing circuit of FIG. 5.

FIG. 6 shows a state machine 600 shown in FIG. 5 which may be the same as the state machine 214 of FIG. 3, except that the state 300-1 of state machine 600 is re-labeled to indicate that state 300-1 activates CLK4 as well as CLK1. The signal applied to the input 306 of the AND gate 302-1 is similarly re-labeled.

Figure 7:
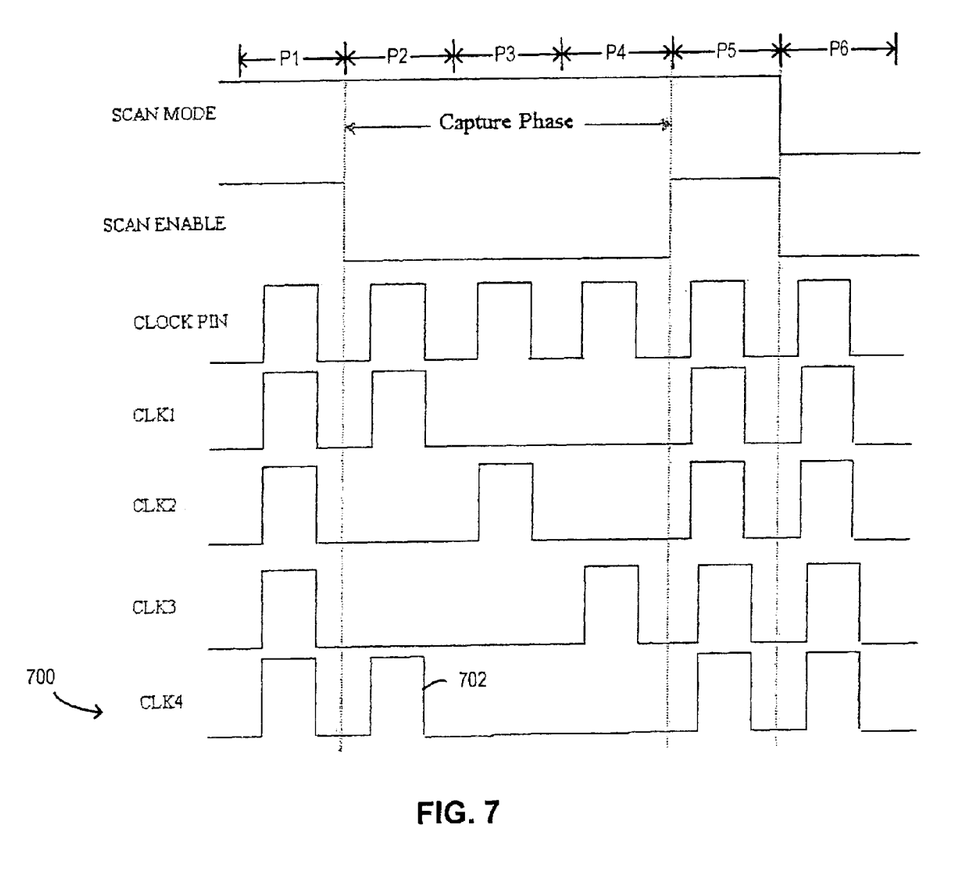
FIG. 7 is a waveform diagram that illustrates operation of the circuitry of FIGS. 5 and 6.

FIG. 7 is a waveform diagram that is the same as FIG. 4, except that FIG. 7 also includes a waveform 700 that represents CLK4. As indicated by the pulse 702 in CLK4 during time period $P_2$, the input clock signal CLK is coupled from the clock pin 102-C to the fourth scan chain 106-4 (FIG. 1) during that period, in addition to being coupled to the first scan chain 106-1. The absence of pulses in CLK4 during time periods $P_1$ and $P_4$ shows that CLK is not coupled to the fourth scan chain 106-4 during those time periods.

Figure 8:
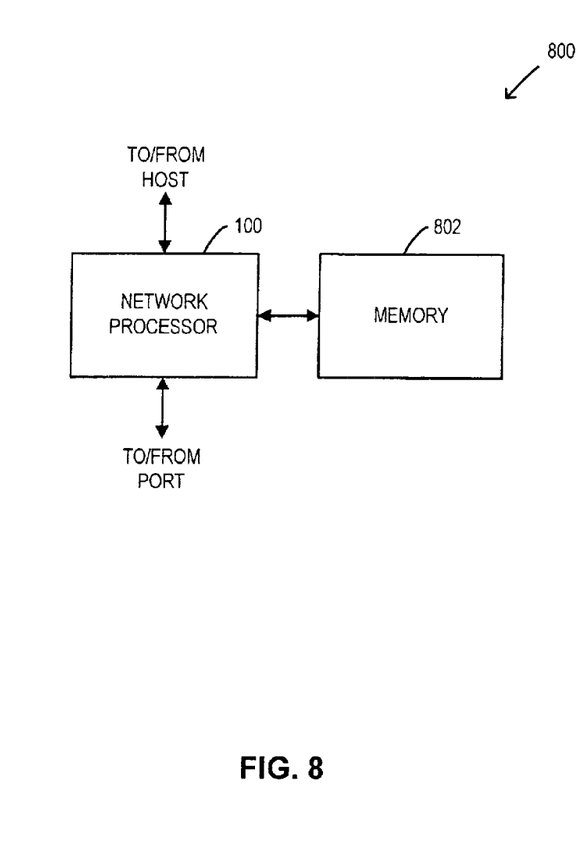
FIG. 8 is a partial block diagram of an apparatus that includes an integrated circuit according to some embodiments.

FIG. 8 is a partial block diagram of an apparatus 800 according to some embodiments that may include an integrated circuit 100 of the type illustrated in the previous drawings.

In apparatus 800 the integrated circuit 100 has the functionality of a network processor. The apparatus 800 also includes one or more memory components 802 that are coupled to the integrated circuit 100. The memory components 802 may be constituted by RAM and/or flash memory, for example.

The integrated circuit 100 is coupled between a host device (not shown), such as a personal computer or a server, and a communication port (not shown), which may be connected to a communication network (which is not shown).

The integrated circuit 100 may be used in other embodiments, such as a test bed.

In the case where the integrated circuit of FIG. 1 has the functionality of a microprocessor, it may be incorporated in any number of different types of computing devices.

As used herein and in the appended claims, "pin" includes a contact, pad or foot by which a circuit is or may be coupled to an external device.

As used herein and in the appended claims, "scan chain" may refer to a circuit arrangement as described in IEEE standard 1149.1, published in 1990, and may refer to a connection of sequential elements operated as a shift register to aid in testing by shifting in test data, capturing system data and shifting out system responses.

As used herein and in the appended claims, "scan mode" refers to a mode in which sequential design elements (such as flip-flops and latches) are operated as control and/or observation points for test purposes.

As used herein and in the appended claims, "capture phase" refers to a phase of operation in which behavior of an integrated circuit is captured by setting the circuit to a certain state and allowing the circuit to operate for one or a number of cycles from that state.

As used herein and in the appended claims, "integrated circuit" includes an electronic device made with a silicon material.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:

applying a clock signal to a clock pin; and alternating transmission of the clock signal from the clock pin among a plurality of scan chains;

wherein the alternating takes place during a scan mode.

2. The method of claim 1, further comprising:

simultaneously transmitting the clock signal from the clock pin to all of the scan chains.

3. The method of claim 1, wherein the plurality of scan chains includes three scan chains.

4. The method of claim 3, wherein the alternating includes operating a state machine in a mode to transition among a plurality of states.

5. The method of claim 3, further comprising:

simultaneously transmitting the clock signal from the clock pin to all of the scan chains.

6. The method of claim 3, wherein during the alternating the clock signal is simultaneously transmitted to two of the scan chains.

7. The method of claim 1, wherein the alternating takes place during a capture phase of the scan mode.

8. An apparatus comprising:

a clock pin;

a first scan chain;

a second scan chain;

a third scan chain;

a fourth scan chain; and a circuit to selectively couple the clock pin to the first scan chain and the second scan chain, the circuit to couple the clock pin to the first scan chain and not to the second scan chain during a first time period and to couple the clock pin to the second scan chain and not to the first scan chain during a second time period that is different from the first time period, the circuit including:

a first multiplexer connected between the clock pin and the first scan chain;

a second multiplexer connected between the clock pin and the second scan chain;

a third multiplexer connected between the clock pin and the third scan chain; and a state machine which has an input coupled to the clock pin, a first output coupled to an input of the first multiplexer, a second output coupled to an input of the second multiplexer and a third output coupled to an input of the third multiplexer;

wherein an output of the first multiplexer is coupled to the fourth scan chain.

9. An apparatus comprising:

an integrated circuit; and a memory coupled to the integrated circuit;

wherein the integrated circuit includes:

a clock pin;

a first scan chain;

a second scan chain;

a third scan chain; and a clock sharing circuit to selectively couple the clock pin to the first scan chain and the second scan chain;

wherein:

the clock sharing circuit is to couple the clock pin to the first scan chain and not to the second scan chain during a first time period, and is to couple the clock pin to the second scan chain and not to the first scan chain during a second time period that is different from the first time period; and the clock sharing circuit includes;

a first multiplexer connected between the clock pin and the first scan chain;

a second multiplexer connected between the clock pin and the second scan chain;

a third multiplexer connected between the clock pin and the third scan chain and a state machine which has an input coupled to the clock pin, a first output coupled to an input of the first multiplexer, a second output coupled to an input of the second multiplexer and a third output coupled to an input of the third multiplexer.

10. The apparatus of claim 9, wherein the integrated circuit further includes:

a fourth scan chain;

wherein an output of the first multiplexer is coupled to the fourth scan chain.

* * * * *